United States Patent
Kishimoto (10) Patent No.: US 10,391,772 B2
(45) Date of Patent: Aug. 27, 2019

(54) SILICON SUBSTRATE PROCESSING METHOD AND LIQUID EJECTION HEAD MANUFACTURING METHOD

(71) Applicant: CANON KABUSHIKI KAISHA, Tokyo (JP)

(72) Inventor: Keisuke Kishimoto, Yokohama (JP)

(73) Assignee: CANON KABUSHIKI KAISHA, Tokyo (JP)

(*) Notice: Subject to any disclaimer, the term of this patent is extended or adjusted under 35 U.S.C. 154(b) by 10 days.

(21) Appl. No.: 15/906,262

(22) Filed: Feb. 27, 2018

(65) Prior Publication Data
US 2018/0264818 A1 Sep. 20, 2018

(30) Foreign Application Priority Data
Mar. 16, 2017 (JP) ................. 2017-051694

(51) Int. Cl.
*B41J 2/16* (2006.01)
*B41J 2/14* (2006.01)
*C30B 29/06* (2006.01)
*C30B 33/00* (2006.01)
*C30B 33/08* (2006.01)

(52) U.S. Cl.
CPC .......... *B41J 2/1629* (2013.01); *B41J 2/1433* (2013.01); *B41J 2/14145* (2013.01); *B41J 2/1603* (2013.01); *B41J 2/1628* (2013.01); *B41J 2/1634* (2013.01); *B41J 2/1639* (2013.01); *C30B 29/06* (2013.01); *C30B 33/00* (2013.01); *C30B 33/08* (2013.01); *B41J 2202/22* (2013.01)

(58) Field of Classification Search
CPC .... B41J 2/1634; B41J 2/1639; B41J 2/14145; B41J 2/1628; B41J 2/1629; B41J 2/1603; B41J 2202/22; C30B 33/00; C30B 33/08; C30B 29/06
See application file for complete search history.

(56) References Cited

U.S. PATENT DOCUMENTS

| | | | |
|---|---|---|---|
| 6,672,712 B1 | 1/2004 | Donaldson et al. | |
| 7,040,735 B2 | 5/2006 | Donaldson et al. | |
| 7,198,726 B2 | 4/2007 | Donaldson et al. | |
| 7,275,813 B2 * | 10/2007 | Ushijima | B41J 2/14145 347/56 |

(Continued)

FOREIGN PATENT DOCUMENTS

JP 2004-148825 A 5/2004

*Primary Examiner* — Savitri Mulpuri
(74) *Attorney, Agent, or Firm* — Venable LLP (57) ABSTRACT

Provided is a silicon substrate processing method including: providing a silicon substrate with a sacrificial layer formed in the form of an island on the front surface thereof, the front surface being a surface on a side where the flow path of an ejection port for ejecting liquid is to be formed, the sacrificial layer having a higher etching rate than the silicon substrate; forming a mask layer on the back surface, the back surface being a surface opposite from the front surface, the mask layer being a layer that does not include an opening at a portion of the back surface opposite from the sacrificial layer; forming a non-penetrating hole from an opening on the back surface of the silicon substrate; and forming a beam on the back surface side by performing anisotropic etching on the silicon substrate in which the non-penetrating hole is formed.

14 Claims, 8 Drawing Sheets

(56) References Cited

U.S. PATENT DOCUMENTS

| | | | |
|---|---|---|---|
| 7,695,104 B2 | 4/2010 | Donaldson et al. | |
| 7,824,560 B2 * | 11/2010 | Sakai | B41J 2/1603 |
| | | | 216/2 |
| 8,091,234 B2 | 1/2012 | Ibe et al. | |
| 8,114,305 B2 | 2/2012 | Komiyama et al. | |
| 8,177,988 B2 | 5/2012 | Komiyama et al. | |
| 8,197,705 B2 | 6/2012 | Kishimoto et al. | |
| 8,287,747 B2 | 10/2012 | Kishimoto et al. | |
| 8,329,047 B2 * | 12/2012 | Nagami | B41J 2/1603 |
| | | | 216/2 |
| 8,613,862 B2 | 12/2013 | Asai et al. | |
| 8,858,812 B2 | 10/2014 | Furusawa et al. | |
| 9,333,749 B2 * | 5/2016 | Kato | B41J 2/1603 |
| 9,555,632 B2 * | 1/2017 | Watanabe | H01L 21/02019 |
| 2012/0088317 A1 | 4/2012 | Kishimoto et al. | |
| 2016/0347064 A1 | 12/2016 | Kishimoto et al. | |

\* cited by examiner

SILICON SUBSTRATE PROCESSING METHOD AND LIQUID EJECTION HEAD MANUFACTURING METHOD

BACKGROUND OF THE INVENTION

Field of the Invention

The present disclosure relates to a silicon substrate processing method and a liquid ejection head manufacturing method.

Description of the Related Art

Processing a silicon substrate by, for example, forming recesses, through holes, and surficial films has been known, and employing the processed silicon substrate for micro electro mechanical systems (MEMS), which are components of electronic devices, has been known. A silicon substrate thus processed may be used as a part of a liquid ejection head, which is employed for inkjet recording or the like. Also, forming beams inside an ink supply port formed in the silicon substrate to enhance the strength of the substrate has been known.

Japanese Patent Laid-Open No. 2004-148825 describes a technique of forming an ink supply port having beams on the back surface of a substrate. The technique described in Japanese Patent Laid-Open No. 2004-148825 is as follows. A mask is formed on the back surface of the substrate at the portions where the beams are to be formed. Silicon processing (laser grooving, dry etching) is performed on the portion in which the ink supply port is to be formed. Then, etching is performed from both of the front surface and the back surface. As a result, the silicon remains at the portions of the back surface of the substrate where the beams should be formed, so that the beams are formed.

There has been a method in which ejection energy generating elements that ejects ink and an ink flow path forming member with ink ejection ports and the like are formed on the front surface of a silicon substrate, and then etching is performed from the back surface of the silicon substrate to form an opening portion of an ink supply port. In such a method, since the ink flow path forming member and so on are formed on the front surface of the silicon substrate, it is impossible to apply a technique as described in Japanese Patent Laid-Open No. 2004-148825, in which etching is performed from both of the front surface and the back surface.

SUMMARY OF THE INVENTION

A silicon substrate processing method according to an aspect of the present disclosure includes: providing a silicon substrate with a sacrificial layer formed in a form of an island on a front surface thereof, the front surface being a surface on a side where a flow path of an ejection port for ejecting liquid is to be formed, the sacrificial layer having a higher etching rate than the silicon substrate; forming a mask layer on a back surface of the silicon substrate, the back surface being a surface opposite from the front surface, the mask layer being a layer that does not include an opening at a portion of the back surface opposite from the sacrificial layer; forming a non-penetrating hole from an opening on the back surface of the silicon substrate; and forming a beam on the back surface side by performing anisotropic etching on the silicon substrate in which the non-penetrating hole is formed.

Further features of the present invention will become apparent from the following description of exemplary embodiments with reference to the attached drawings.

DESCRIPTION OF THE EMBODIMENTS

An embodiment of the present disclosure will now be described with reference to the drawings. Note that the following embodiment does not limit the present disclosure. Moreover, the entire combination of the features described in this embodiment is not necessarily essential for the solution provided by the present disclosure. Note that identical components will be described with the same reference numeral given thereto. Also, the relative arrangement, shapes, and so on of constituent components described in the embodiment are merely exemplary, and the scope of the disclosure is not intended to be limited solely to those.

A silicon substrate processing method to be described in this embodiment can be used in a process of manufacturing a device (structure) such as an inkjet recording head to form a through hole such as a liquid supply port for the inkjet recording head into a silicon substrate. In particular, the silicon substrate processing method can be used to form a through hole such as a liquid supply port for an inkjet recording head (also referred to as "ink supply port") from one surface of a silicon substrate. The one surface of the silicon substrate is the surface opposite from the surface on the side where ejection ports and flow paths that communicate with the ejection ports are formed (hereinafter the former will be referred to as "back surface" while the latter will be referred to as "front surface"). The example to be described in this embodiment is a mode in which the through hole is formed from the back surface side of the silicon substrate. The front surface may also be referred to as a first surface and the back surface may also be referred to as a second surface.

In the formation of the ink supply port via etching of the silicon substrate from its back surface, beams may be formed at the back surface of the silicon substrate by the following first method. In the first method, a mask is formed on the portions of the back surface where the beams are to be formed so that the portions where the beams are to be formed will not be etched. Then, anisotropic etching is performed to thereby form the ink supply port with the beams. However, in the first method, in which the anisotropic etching is performed after simply forming the mask, the etching time required to form the ink supply port is long. For this reason, the etching progresses also to the portions where the beams are to be formed, and makes it impossible to form the required beams. Consequently, the strength of the substrate is lowered.

In order to increase the speed of the etching, a second method may be considered in which a sacrificial layer is disposed over the entire front surface of the silicon substrate. The sacrificial layer is a layer having a higher etching rate than the silicon substrate. This etching rate is the rate of etching in a setting where the silicon substrate and the sacrificial layer are etched by the same etchant, and in particular the rate at which the silicon substrate is etched by the etchant. The sacrificial layer is a layer that serves to define the opening width of the supply port on the front surface side. Further, in the second method, non-penetrating holes are formed toward the front surface from the portion of the back surface where no beam is to be formed. Etching is then performed from the back surface. The etching progresses from the non-penetrating holes to the sacrificial layer, and an opening is formed in the sacrificial layer. The etching then progresses from the sacrificial layer side (front surface side) as well. In this way, the etching time is shorter than that in the first method, which makes it possible to form the required beams. With this second method, however, the ink supply port cannot be opened to have an even opening width at the front surface. Consequently, ejection performance is deteriorated.

In this embodiment, prior to the etching process on the silicon substrate, the sacrificial layer is disposed on the front surfaces of the portions on the back surfaces of which the beams are to be formed. In other words, the sacrificial layer is formed in the shape of islands instead of being formed over the entire front surface (first surface). Then, the non-penetrating holes are formed by irradiating the portion of the silicon substrate where no beam is to be formed, with laser light from the back surface side (second surface side). Etching is then performed from the back surface, so that the ink supply port and the beams are formed.

Figure 1:
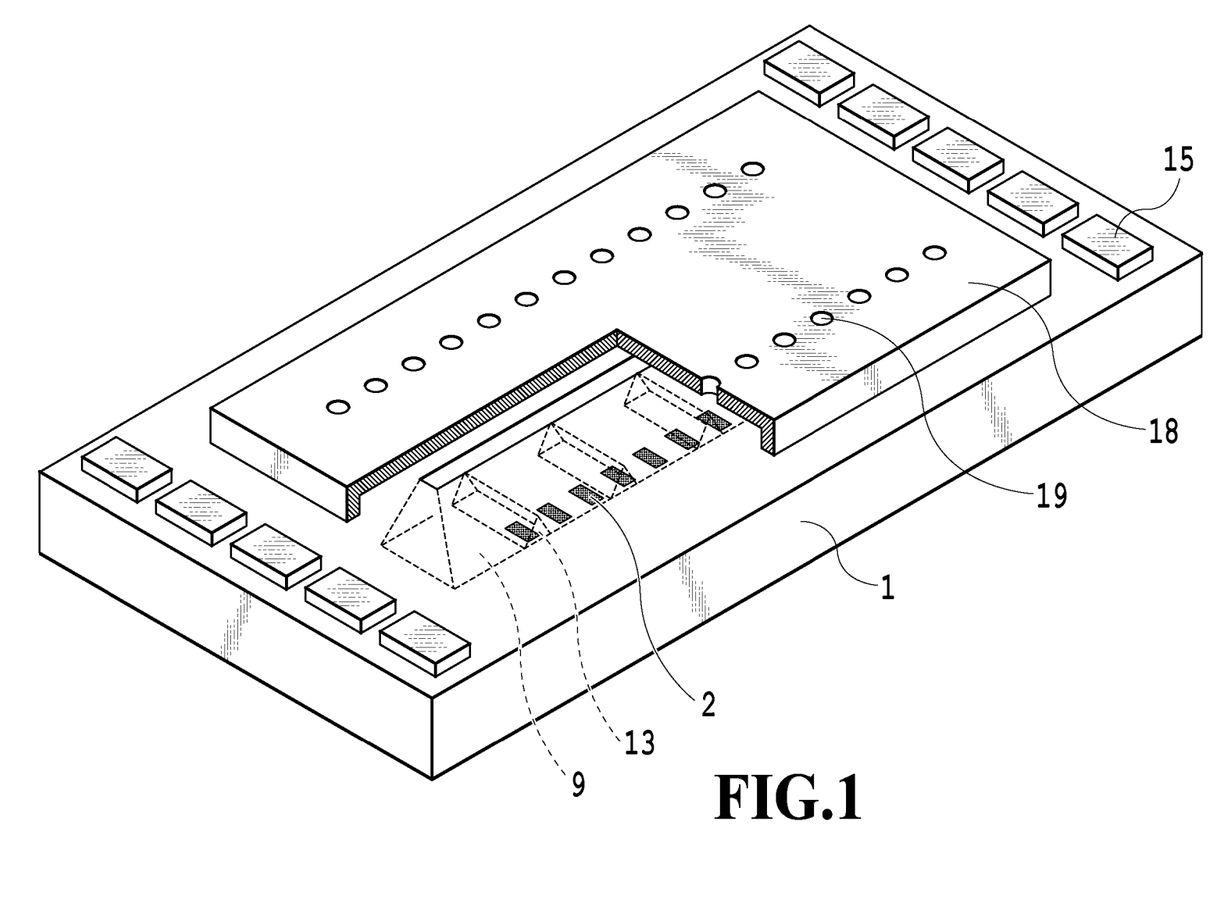
FIG. 1 is a perspective view illustrating an example of a liquid ejection head.

FIG. 1 is a perspective view of an inkjet recording head substrate as an example of a liquid ejection head substrate. The inkjet recording head substrate illustrated in FIG. 1 includes a silicon substrate 1 processed using the silicon substrate processing method to be described in this embodiment. In other words, the inkjet recording head substrate illustrated in FIG. 1 represents an inkjet recording head substrate manufactured by the manufacturing method to be described in this embodiment.

In the inkjet recording head substrate illustrated in FIG. 1, electrothermal conversion elements 2, or heaters, as ejection energy generating elements that ejects ink, are disposed on the front surface of the silicon substrate 1. Also, an ink flow path forming member 18 that includes ink ejection ports 19 and gold bumps 15 that externally receive electricity are formed on the front surface of the silicon substrate 1. An ink supply port 9 is formed in the silicon substrate 1. The ink supply port 9 is opened at the top and the bottom. The top of the ink supply port 9 communicates with ink flow paths formed in the ink flow path forming member 18. Ink supplied from the ink supply port 9 is supplied to the ink ejection ports 19 through the ink flow paths. The ink is then ejected from the ink ejection ports 19 in accordance with control on the electrothermal conversion elements 2. The silicon substrate processing method to be described in this embodiment includes a step of forming beams 13 inside this ink supply port 9.

Figure 2A:
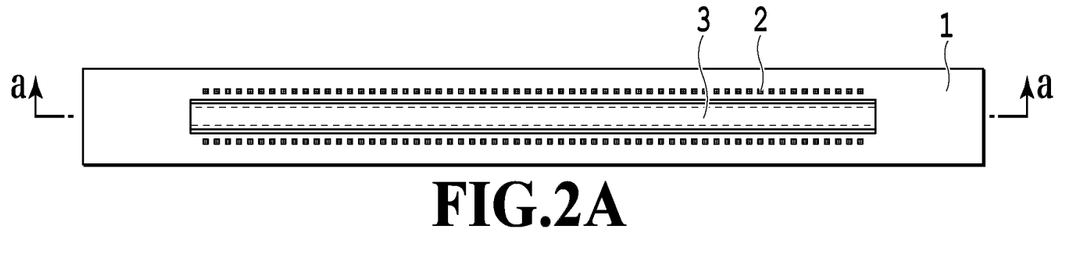
FIGS. 2A and 2B are views illustrating an example of a processed silicon substrate.
Figure 2B:
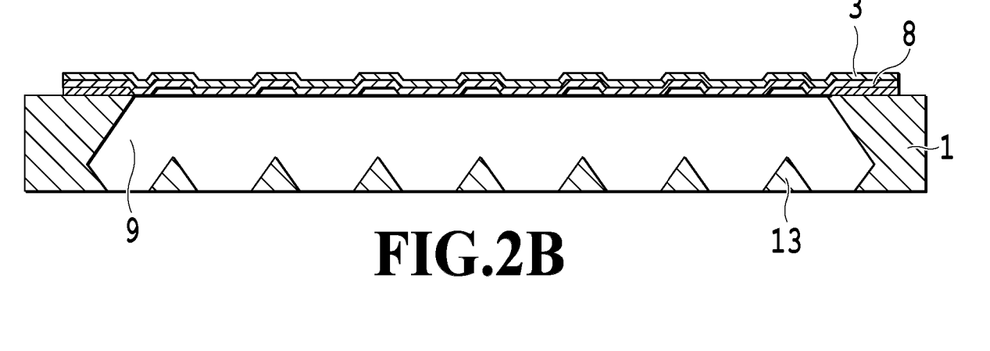

FIGS. 2A and 2B are views of a part of the silicon substrate 1 in FIG. 1. Specifically, FIGS. 2A and 2B illustrate an example of the silicon substrate 1 after being processed using the processing method to be described in this embodiment. FIG. 2A is a plan view of the silicon substrate 1, and FIG. 2B is a cross-sectional view taken along the line a-a of FIG. 2A.

The silicon substrate 1 to be used in this embodiment is monocrystalline silicon with a back surface having its crystal axis on the (100) plane. The electrothermal conversion elements 2 are formed on the front surface of this silicon substrate 1, as mentioned above. An etch-resistant passivation layer not illustrated is formed on the front surface of the silicon substrate 1 as a protection layer for the electrothermal conversion elements 2. Note that control signal input electrodes for driving the electrothermal conversion elements 2 are electrically connected to these elements. The ink supply port 9 is formed in the silicon substrate 1, so that a through port (ink supply port) penetrating through the substrate is formed. Also, though not illustrated in FIG. 2A or 2B, the ink flow path forming member 18, including the ink ejection ports 19, is formed on top of the front surface of this silicon substrate 1, as illustrated in FIG. 1.

In manufacturing the inkjet recording head, it is preferable to perform a step of forming the electrothermal conversion elements 2 on the silicon substrate 1 and further forming the ink flow path forming member 18 on the front surface of the silicon substrate 1 before a step of forming the ink supply port 9. Specifically, the ink flow path forming member 18 including the ink ejection ports 19 for ejecting liquid (ink) and the liquid flow paths (ink flow paths) communicating with the ink ejection ports 19 is formed on the front surface of the silicon substrate 1 on which the electrothermal conversion elements 2 are formed. Then, a step of forming the ink supply port 9 and the beams 13 are performed.

FIGS. 3A to 3D are views illustrating plans of a part of the silicon substrate 1 and cross sections thereof taken along the line a-a. FIGS. 3A to 3D schematically and sequentially illustrate how processing steps are performed. The left sides of FIGS. 3A to 3D illustrate the plans while the right sides illustrate the cross sections. Further, FIGS. 4A to 4D are views illustrating plans of the same part in the same steps as FIGS. 3A to 3D and cross sections thereof taken along the line b-b. FIGS. 5A to 5D are views illustrating plans of the same part in the same steps as FIGS. 3A to 3D and cross sections thereof taken along the line c-c. The silicon substrate processing method in this embodiment will now be described with reference to FIGS. 3A to 5D.

<Silicon Substrate Providing Step>

Figure 3A:
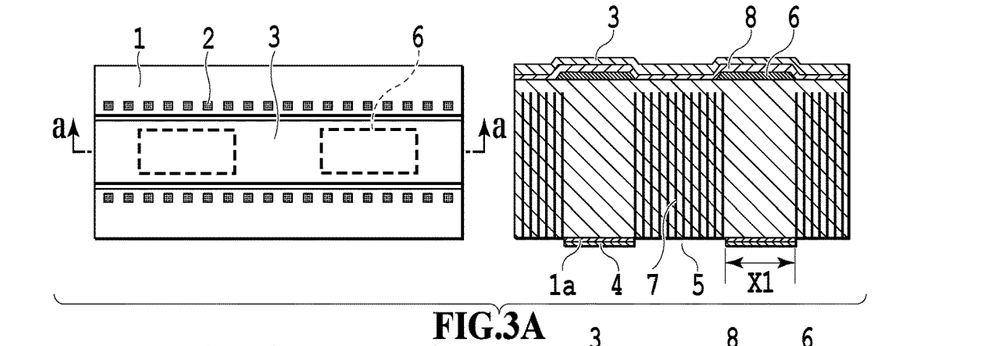
FIGS. 3A to 3D are schematic plan views and cross-sectional views for explaining steps in a silicon substrate processing method.

First, a step of providing the silicon substrate in which to form the ink supply port 9 is performed. The silicon substrate to be provided is the silicon substrate 1 with the electrothermal conversion elements 2 and the ink flow path forming member 18 formed on the front surface, as mentioned above. As illustrated in FIG. 3A, a sacrificial layer 6, a passivation layer 3, and an etching stop layer 8 are formed on the front surface of the silicon substrate 1 in a step of forming circuits including the electrothermal conversion elements 2 on the front surface of the silicon substrate 1. In this step, the sacrificial layer 6 is formed into the form of islands as illustrated in FIG. 3A. Being formed into the form of islands means that the sacrificial layer 6 is not formed horizontally continuously (seamlessly) but is formed with one part separated from another. The sacrificial layer 6 is formed on the front surface at positions opposite from the positions on the back surface at which the beams 13 are to be formed. Note that the positions at which the beams 13 are to be formed in a later-described step and the positions at which the sacrificial layer 6 is formed do not need to completely coincide with each other but may be offset from each other. The sacrificial layer 6 is formed on the front surface of the silicon substrate 1 at some positions within the area in which the ink supply port 9 is to be formed. The sacrificial layer 6 is covered by the etching stop layer 8, and the etching stop layer 8 is covered by the passivation layer 3. Though not illustrated in any of FIGS. 3A to 3D, the electrothermal conversion elements 2 and the ink flow path forming member 18 are formed on top of the passivation layer 3, as mentioned above. Now, the silicon substrate 1 on which the sacrificial layer 6 is formed in the form of islands is provided. The sacrificial layer 6 can be formed using, for example, an Al—Si (aluminum-silicon) alloy or a material of a conductive film such as Al—Cu (aluminum-copper) or Cu (copper). The passivation layer 3 and the etching stop layer 8 can be formed using SiO (silicon oxide film), SiN (silicon nitride film), or the like.

<Etching Mask Layer Forming Step>

Next, a step of forming an etching mask layer 4 on the back surface of the provided silicon substrate 1 is performed, the etching mask layer 4 being a layer that does not include an opening at the portions of the back surface opposite from the sacrificial layer 6. As illustrated in FIG. 3A, a step of forming the etching mask layer 4 with an opening portion 5 is performed on the back surface of the silicon substrate 1 with the sacrificial layer 6, the passivation layer 3, and the etching stop layer 8 formed on the front surface. The etching mask layer 4 does not include any opening (opening portion) at its portions situated opposite from the sacrificial layer 6 on the front surface, but includes an opening (opening portion 5) at its portion not situated opposite from the sacrificial layer 6 on the front surface. The silicon substrate 1 is covered by a thermally oxidized film 1a, which is an SiO layer. Note that the thermally oxidized film 1a on the front surface over the area of the ink supply port 9 is removed in the step of forming the sacrificial layer 6. The thermally oxidized film 1a can be removed using buffered hydrofluoric acid or the like. The etching mask layer 4 can be formed using polyamide, polyimide, or the like.

A length X1 of each non-opening portion of the etching mask layer 4 (the length of each mask portion) is determined taking into account the size of each island of the island-form sacrificial layer 6 and the crystal plane of the silicon substrate 1. Specifically, the length X1 of each non-opening portion of the etching mask layer 4 preferably satisfies inequality 1 below. More specifically, the length X1 satisfies $$L-(T1/\tan 54.7°)×2 \geq X1 \geq L-(T2/\tan 54.7°)×2 \quad \text{(Inequality 1)}$$

where L is the size of each island, and the depth of each non-penetrating hole 7 from the surface opposite from the back surface (i.e. the front surface) is not smaller than T1 and not larger than T2 (μm).

The size L of each island of the sacrificial layer 6 is not smaller than 120 μm and not larger than 1100 μm. In this case, with inequality 1 applied, the length X1 of each non-opening portion of the etching mask layer 4 is not smaller than 98 μm and not larger than 993 μm. If the length X1 of the non-opening portion is smaller than 98 μm, the beam 13 will disappear by etching. Also, if the length X1 of the non-opening portion is larger than 993 μm, the beam 13 will be formed to have a large width, so that the height of the beam 13 will be accordingly large. The large height of the beam 13 deteriorates the ink flow in the ink supply port and thus deteriorates ejection properties of the inkjet recording head.

<Supply Port Forming Step>

Next, a step of forming the non-penetrating holes 7 from the opening (opening portion 5) on the back surface of the silicon substrate 1 on which the etching mask layer 4 is formed is performed. Then, a step of forming the beams 13 on the back surface side is performed by performing anisotropic etching on the silicon substrate 1 in which the non-penetrating holes 7 are formed. This step of forming the beams 13 is also the step of forming the ink supply port 9. In other words, the beams 13 are also formed in the step of forming the ink supply port 9.

First, as illustrated in FIG. 3A, the step of forming the non-penetrating holes 7 is performed by irradiating the opening portion 5 of the etching mask layer 4 with laser light from the back surface of the silicon substrate 1. In the step of forming the non-penetrating holes 7, the non-penetrating holes 7 are formed using laser light of a YAG laser. The output and frequency of the laser light are set to appropriate values. In this embodiment, the diameter of each non-penetrating hole 7 is set to about φ25 μm. The diameter of the non-penetrating hole 7 is preferably not smaller than φ5 μm and not larger than 100 μm. It is not preferable for the diameter of the non-penetrating hole 7 to be excessively small, since it will be difficult for etchant to enter the non-penetrating hole 7 in the anisotropic etching to be performed in the next step. Also, it is not preferable for the diameter of the non-penetrating hole 7 to be excessively large, since a relatively long time will be required to form the non-penetrating hole 7 to the desired depth. Preferably, the pitch between the non-penetrating holes 7 is roughly not smaller than 25 μm and not larger than 500 μm.

In this embodiment, a silicon substrate with a thickness of 725 μm is used as the silicon substrate 1. The depth of each non-penetrating hole at its closed portion (i.e. the distance from the front surface of the silicon substrate 1) can be not smaller than 15 μm and not larger than 75 μm. If the depth is smaller than 15 μm, the ink flow path forming member 18, which is formed on the front surface, will be deformed by heat. If the depth is larger than 75 μm, the etching time will be long, so that the portions to become the beams 13 will disappear. The non-penetrating holes 7 may be processed by any method. For example, the non-penetrating holes 7 can be processed using laser light with third harmonic waves (THG: wavelength of 355 nm) of a YAG laser. Here, what is required is a wavelength that enables opening of silicon, the material which the silicon substrate 1 is made of, and the laser light used to process the non-penetrating holes 7 is not limited to the above laser light. Also, the non-penetrating holes may be formed by dry etching or machining instead of laser processing.

Figure 3B:
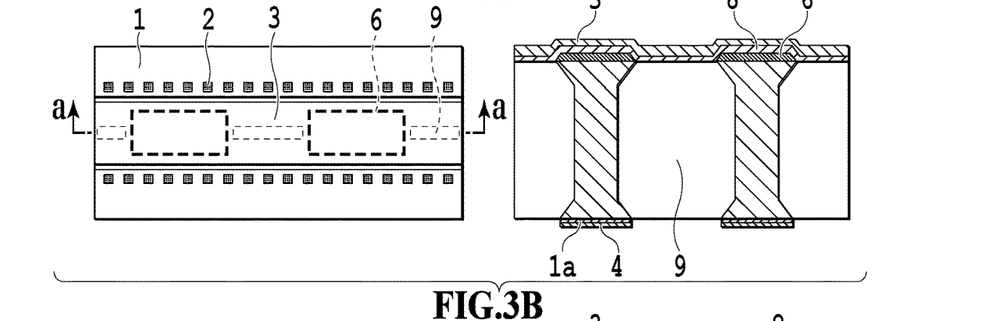

Thereafter, as illustrated in FIG. 3B, the step of forming the ink supply port 9 is performed by performing anisotropic etching on the silicon substrate 1 in which the non-penetrating holes 7 are formed. As for the etching method of forming the ink supply port 9, it is possible to perform crystal anisotropic etching by immersing the silicon substrate 1 in a strong alkaline solution such as tetramethylammonium hydroxide (TMAH) or potassium hydroxide (KOH), for example. At the stage of FIG. 3B, the silicon substrate 1 is penetrated only at the portion where the non-penetrating holes 7 are formed, and the penetration stops at the etching stop layer 8 (see FIGS. 4B and 5B as well).

Figure 3C:
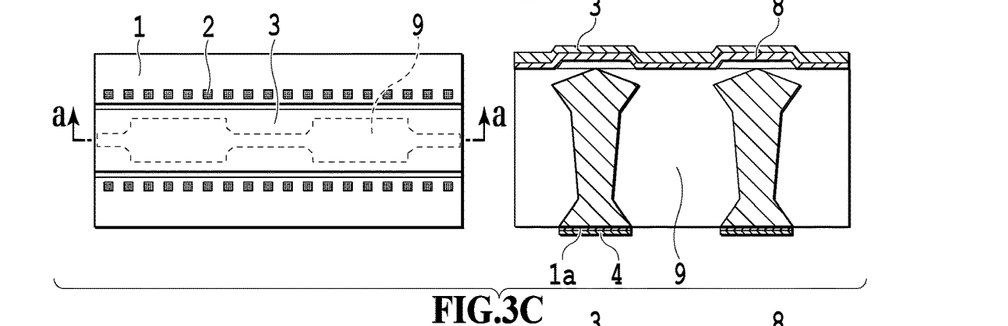
Figure 4A:
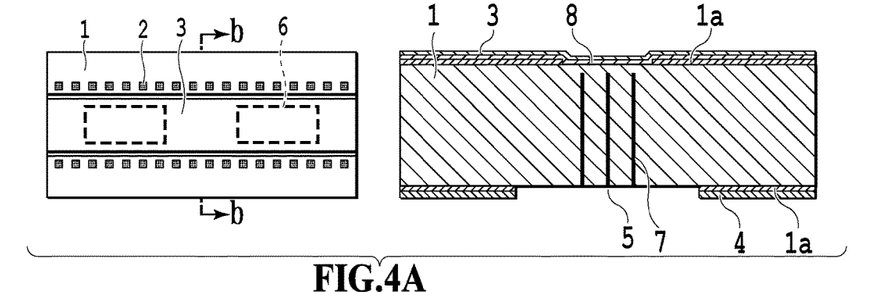
FIGS. 4A to 4D are schematic plan views and cross-sectional views for explaining the steps in the silicon substrate processing method.
Figure 4B:
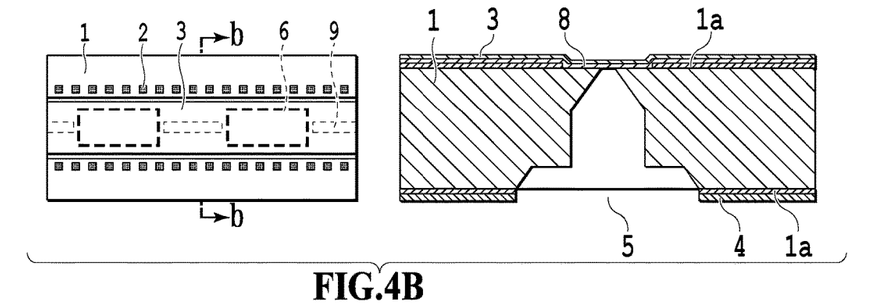
Figure 4C:
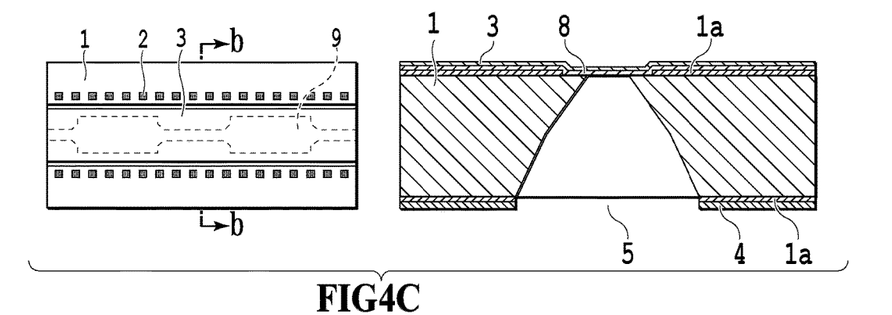

Thereafter, as illustrated in FIG. 3C, the etching spreads laterally from the penetrated portion of the silicon substrate 1 and reaches the sacrificial layer 6. Then, the sacrificial layer 6 is etched while at the same time the etching of the silicon portion of the silicon substrate 1 progresses. Then, the silicon under the etching stop layer 8 on the front surface is also etched with time. In other words, the etching progresses also in the direction toward the back surface of the sacrificial layer 6 from its front surface. The etching spreads laterally at the silicon under the etching stop layer 8 and, as illustrated in FIGS. 4C and 5C, the etching stops progressing at the area of the thermally oxidized film 1a.

The etching rate in each film (layer) is different from the others such that the etching rate is 0.83 μm/min in the sacrificial layer 6, 0.15 μm/min in the etching stop layer 8, and 0.05 μm/min in the thermally oxidized film 1a. The sacrificial layer 6 is made of a material having a higher etching rate than the silicon substrate 1.

Figure 3D:
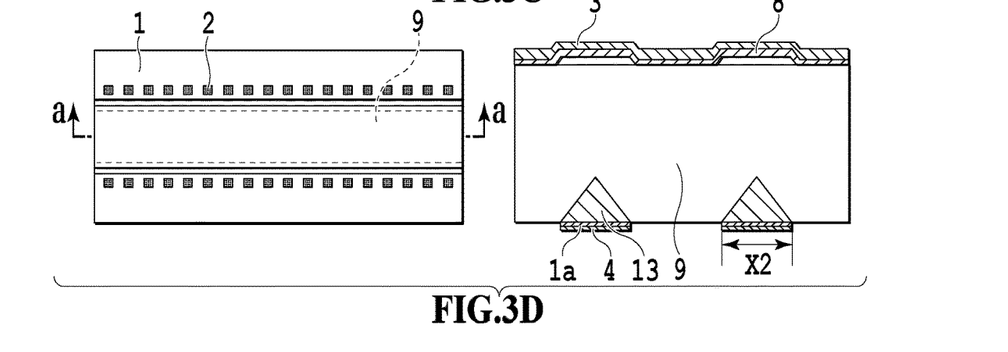
Figure 4D:
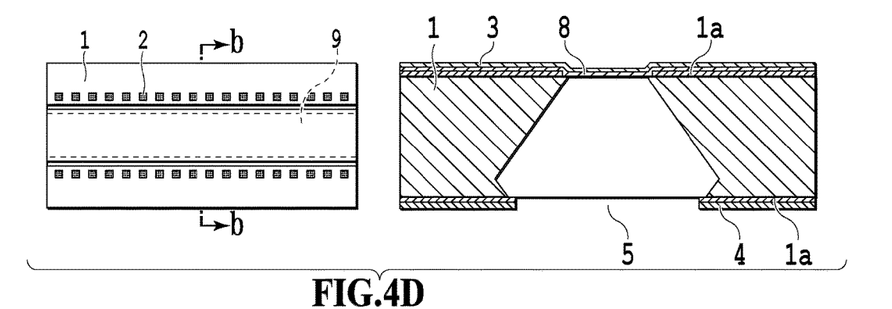
Figure 5A:
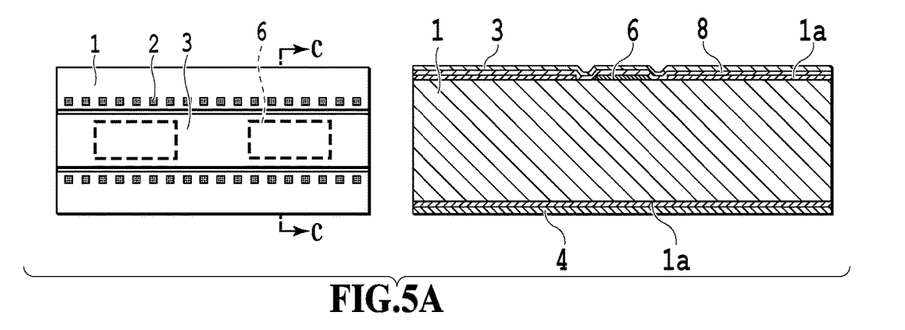
FIGS. 5A to 5D are schematic plan views and cross-sectional views for explaining the steps in the silicon substrate processing method.
Figure 5B:
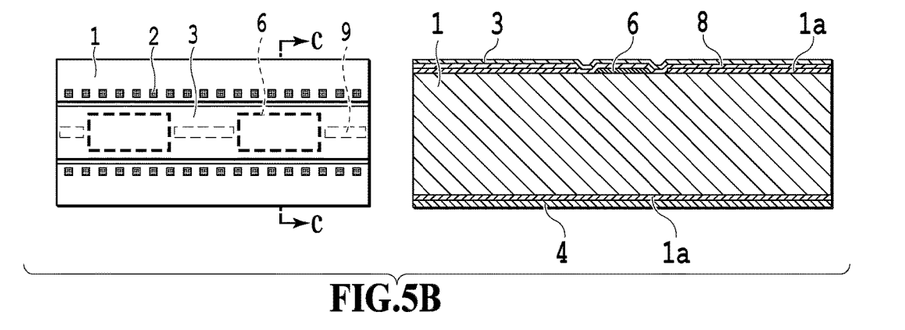
Figure 5C:
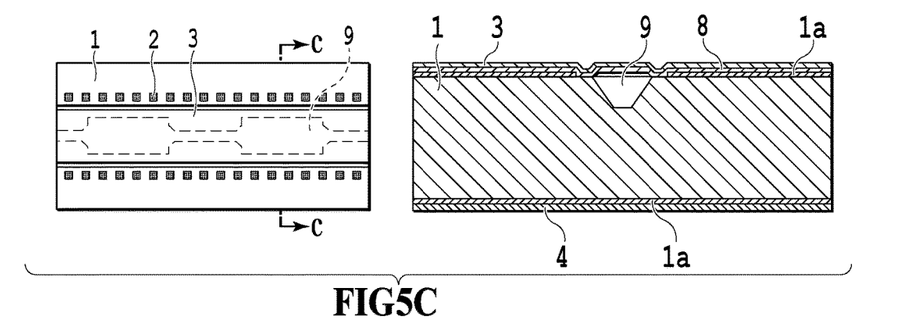
Figure 5D:
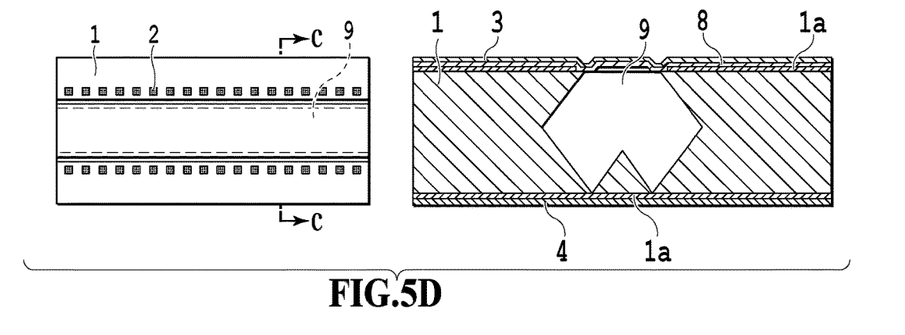

Consequently, as illustrated in FIGS. 3D, 4D, and 5D, the ink supply port 9 is provided in which, by the etching, the front surface side is evenly opened and the beams 13 are formed on the back surface side. The ink supply port 9 can be provided such that each beam 13 has a size X2 of 70 μm to 950 μm.

This embodiment employs the configuration in which the sacrificial layer 6 is formed in the form of islands, and the etching mask layer 4 is formed at the positions opposite from the portions of the front surface on which the sacrificial layer 6 is formed, to prevent etching at those positions. This embodiment further employs the configuration in which the non-penetrating holes 7 are formed from the opening portion 5 and anisotropic etching is performed. According to these configurations, the etching firstly penetrates the silicon substrate 1 and reaches the front surface at the portion in which the non-penetrating holes 7 are formed. The etching then spreads laterally and reaches the sacrificial layer 6. The etching then progresses from the front surface side as well. In this way, the ink supply port 9 can be evenly opened at the front surface.

Meanwhile, if the sacrificial layer 6 is not formed in the form of islands but is formed over the entire front surface of the silicon substrate 1, the etching will first penetrate the silicon substrate 1 at the portion in which the non-penetrating holes 7 are formed, and the etching will reach the sacrificial layer 6, formed over the entire front surface. In this case, the etching progresses at a higher rate at the portion in which the non-penetrating holes 7 are formed than at the portions in which the non-penetrating holes 7 are not formed. For this reason, the ink supply port 9 will be opened at the front surface in different manners at the portion in which the non-penetrating holes 7 are formed and at the portions in which the non-penetrating holes 7 are not formed. This example will be described later as a comparative example.

As described above, in this embodiment, the beams 13 can be formed on the back surface side inside the ink supply port 9 of the silicon substrate 1, and the strength of the silicon substrate 1 can therefore be increased. Hence, for example, in the case where the ink supply port 9 is opened, forming the beams 13 can suppress deformation of the silicon substrate 1, thus improving the production efficiency and quality. Also, in this embodiment, forming the sacrificial layer 6 in the form of islands enables the ink supply port 9 to be opened evenly at the front surface, thus making it possible to suppress deterioration in ink ejection properties.

Example 1

A silicon substrate 1 for an inkjet recording head is provided by following FIGS. 3A to 5D. The following operations are performed for the silicon substrate 1.

First, as illustrated in FIGS. 3A, 4A, and 5A, a sacrificial layer 6 made of an Al—Si (aluminum-silicon) alloy is formed in the form of islands on the front surface of the silicon substrate 1 within the area where an ink supply port 9 is to be formed, at the positions opposite from the portions at which beams 13 are to be formed. The dimension of each island of the sacrificial layer 6 is 430 μm. Moreover, etch-resistant plasma SiO (silicon oxide film) is formed as an etching stop layer 8 on the front surface of the silicon substrate 1. The sacrificial layer 6 and the etching stop layer 8 are formed in the same step as the step of forming electrothermal conversion elements 2, which are energy generating elements, and so on on the front surface of the silicon substrate 1. Polyamide resin is deposited on an SiO layer (thermally oxidized film) 1a of this silicon substrate 1 on its back surface, and an etching mask layer 4 made of the polyamide resin and having an opening portion 5 is formed. The opening portion 5 is not formed at the positions opposite from the portions on the front surface where the sacrificial layer 6 is formed. The SiO layer (thermally oxidized film) 1a within this opening portion 5 is removed by etching it with buffered hydrofluoric acid or the like to thereby expose the silicon surface.

As illustrated in FIGS. 3A, 4A, and 5A, non-penetrating holes 7 are formed from the back surface of the silicon substrate 1 with a (100) plane toward its front surface within the opening portion 5 of the etching mask layer 4. Each non-penetrating hole 7 is formed such that its diameter will be about φ25 μm, the distance from the front surface will be 50 μm, and the pitch between the holes will be 60 μm. The non-penetrating holes 7 are processed using laser light with third harmonic waves (THG: wavelength of 355 nm) of a YAG laser.

Then, as illustrated in FIGS. 3B, 4B, and 5B, etching is performed with the etching mask layer 4, formed on the back surface of the silicon substrate 1 and made of polyamide resin, used as a mask. The etching is performed for five hours using a solution with 22% by mass of tetramethylammonium hydroxide (TMAH) at a temperature of 80° C. The length X1 of each non-opening portion of the etching mask layer 4 is 500 μm. In this etching process, (111) surfaces, on which the etching rate is low, are formed at some spots while the etching progresses at some spots along the (100) plane and the (110) plane, on which the etching rate is high. Finally, (111) surfaces, on which the etching rate is low, are formed.

Then, as illustrated in FIGS. 3C, 4C, and 5C, the etching is performed for another hour using the solution with 22% by mass of tetramethylammonium hydroxide (TMAH) at a temperature of 80° C. The front surface of the portion within the opening portion 5 of the etching mask layer 4, in which the non-penetrating holes 7 are formed, are now opened and spread laterally, so that the etching progresses to the sacrificial layer 6. On the inside, the silicon still remains connected to the front surface.

Then, as illustrated in FIGS. 3D, 4D, and 5D, the etching is performed for another two hours using the solution with 22% by mass of tetramethylammonium hydroxide (TMAH) at a temperature of 80° C. The silicon inside is etched such that the beams 13 are formed. Each beam 13 is formed to have a size X2 of 450 μm. Also, the opening at the front surface is evenly opened to have a width of 130 μm.

Further, though not illustrated, the SiO layer 1a formed on the front surface of the silicon substrate 1 at the opening portion of the ink supply port 9 is removed by wet etching, and the passivation layer 3 is partly removed by dry etching.

Comparative Example

Figure 6A:
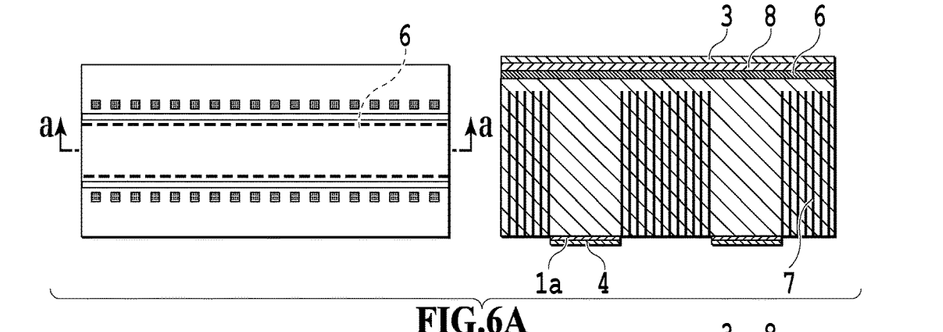
FIGS. 6A to 6D are schematic plan views and cross-sectional views for providing a comparison with the steps in the silicon substrate processing method.
Figure 7A:
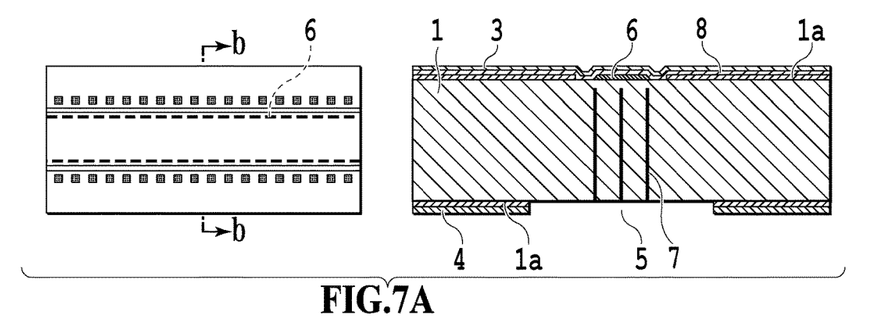
FIGS. 7A to 7D are schematic plan views and cross-sectional views for providing a comparison with the steps in the silicon substrate processing method.
Figure 8A:
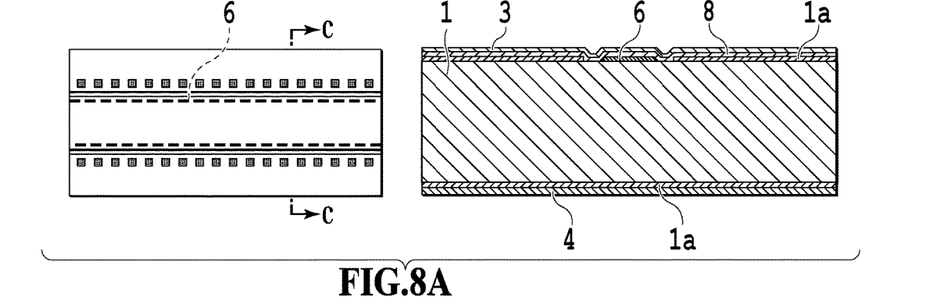
FIGS. 8A to 8D are schematic plan views and cross-sectional views for providing a comparison with the steps in the silicon substrate processing method.

First, as illustrated in FIGS. 6A, 7A, and 8A, a sacrificial layer 6 made of an Al—Si (aluminum-silicon) alloy is formed over the entire surface of the portion of the front surface of a silicon substrate 1 where an ink supply port is to be formed. Moreover, an etch-resistant passivation layer 3 is formed as a protection layer on the front surface of the silicon substrate 1. The sacrificial layer 6 and an etching stop layer 8 are formed in the same step as the step of forming electrothermal conversion elements 2 and so on the front surface of the silicon substrate 1. Polyamide resin is deposited on an SiO layer (thermally oxidized film) 1a on the back surface of this silicon substrate 1, and an etching mask layer 4 made of the polyamide resin and having an opening portion 5 is formed. The width of the opening portion 5 is 500 µm. The SiO layer 1a within this opening portion 5 is removed by etching it with buffered hydrofluoric acid or the like to thereby expose the silicon surface. Non-penetrating holes 7 are formed from the back surface of the silicon substrate 1 with a (100) plane toward its front surface within the opening portion 5 of the etching mask layer 4 such that the diameter of each non-penetrating hole 7 will be about φ25 µm, the distance from the front surface will be 50 µm, and the pitch will be 60 µm.

Figure 6B:
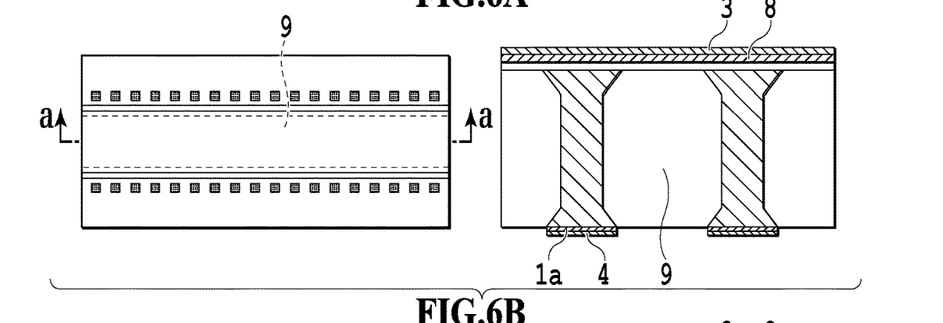
Figure 7B:
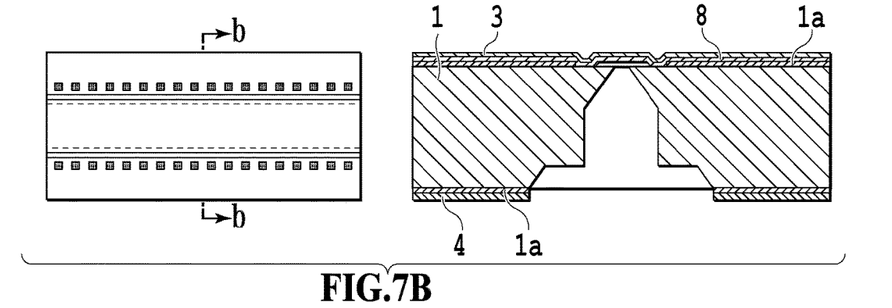
Figure 8B:
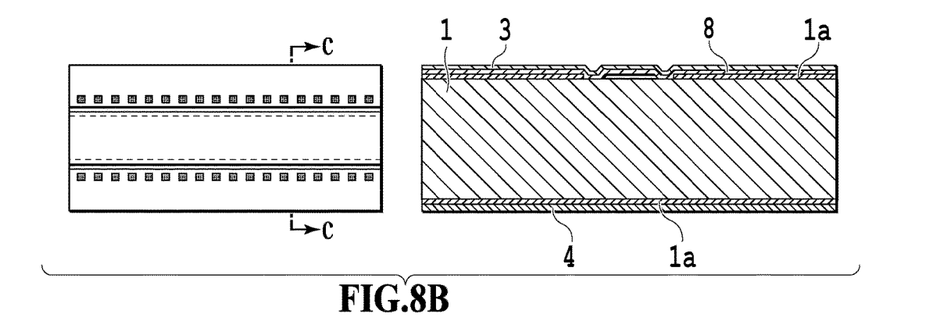

Then, as illustrated in FIGS. 6B, 7B, and 8B, etching is performed with the etching mask layer 4, formed on the back surface of the silicon substrate 1 and made of polyamide resin, used as a mask. The etching is performed for five hours using a solution with 22% by mass of tetramethylammonium hydroxide (TMAH) at a temperature of 80° C.

Figure 6C:
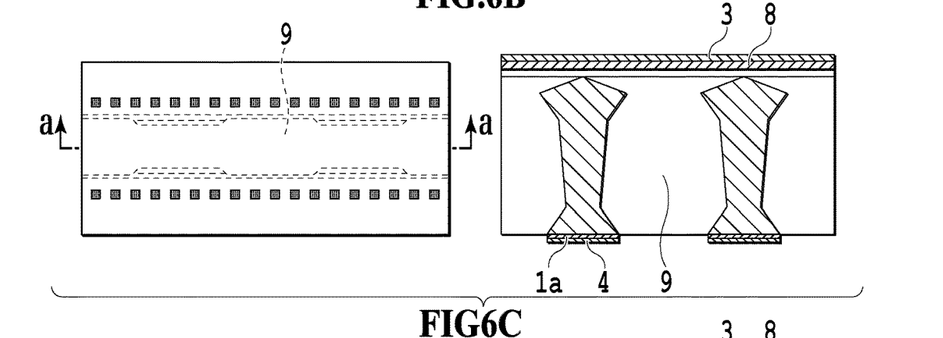
Figure 7C:
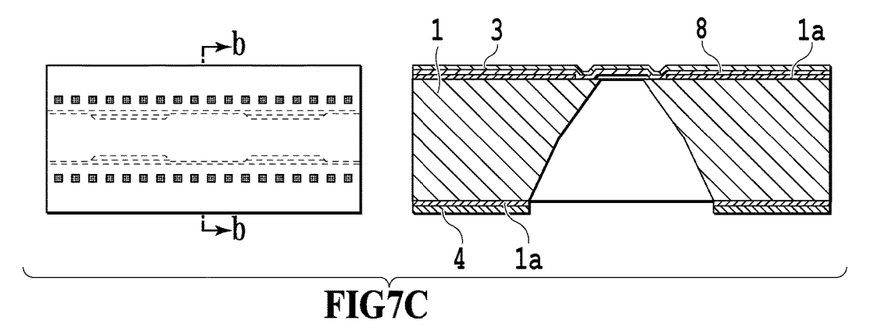
Figure 8C:
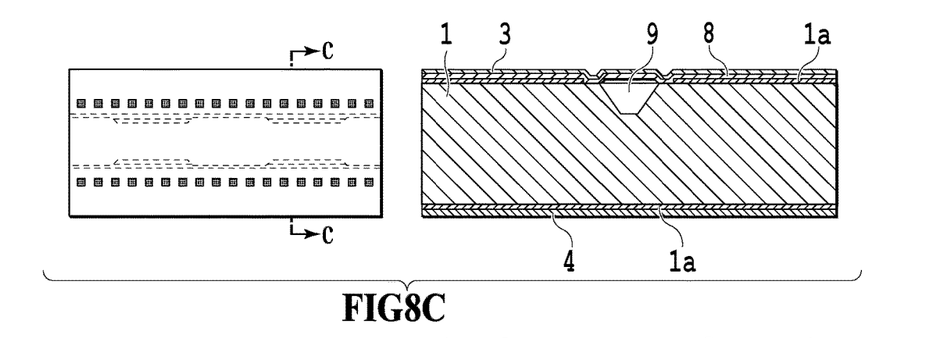

Then, as illustrated in FIGS. 6C, 7C, and 8C, the etching is performed for another hour using the solution with 22% by mass of tetramethylammonium hydroxide (TMAH) at a temperature of 80° C. The front surface of the portion within the opening portion 5 of the etching mask layer 4, in which the non-penetrating holes 7 are formed, are now opened and spread laterally, so that the etching progresses to the sacrificial layer 6. On the inside, the silicon still remains connected to the front surface.

Figure 6D:
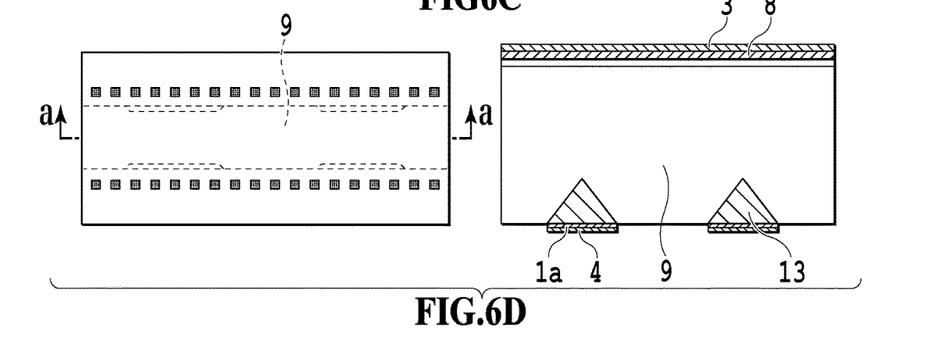
Figure 7D:
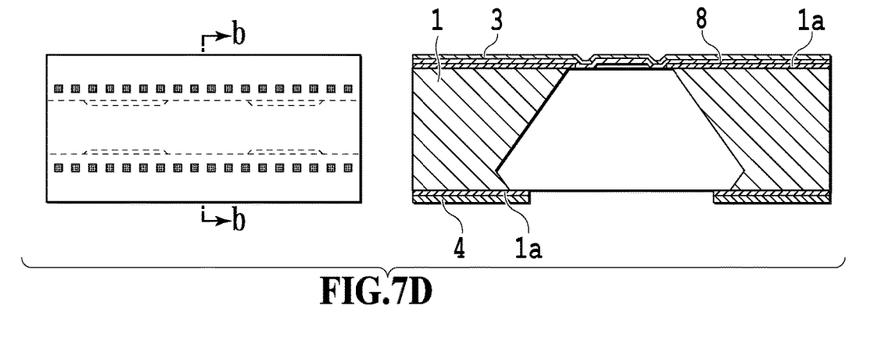
Figure 8D:
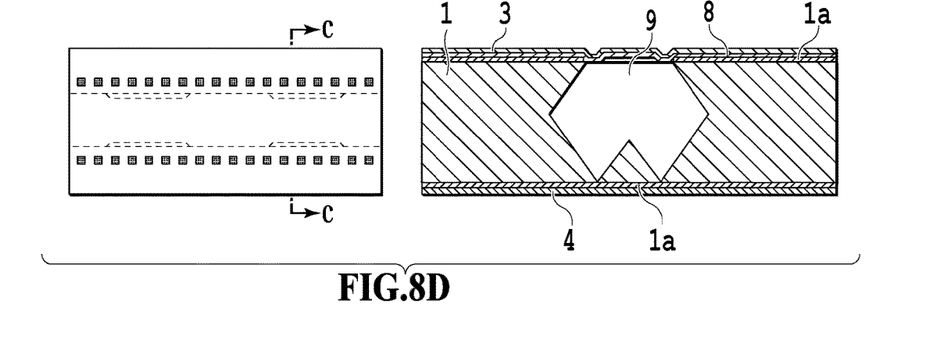

Then, as illustrated in FIGS. 6D, 7D, and 8D, the etching is performed for another two hours using the solution with 22% by mass of tetramethylammonium hydroxide (TMAH) at a temperature of 80° C. The silicon inside is etched such that beams 13 are formed. Each beam 13 is formed to have a size X2 of 450 µm. The opening at the front surface was unevenly opened. Specifically, the portions in which the non-penetrating holes 7 are not formed are opened to have a width of 130 µm whereas the portion in which the non-penetrating holes 7 are formed is opened to have a width of 148 µm.

Further, though not illustrated, the SiO layer 1a formed on the front surface of the silicon substrate 1 at the opening portion of the ink supply port 9 is removed by wet etching, and the passivation layer 3 is partly removed by dry etching.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-051694, filed Mar. 16, 2017, which is hereby incorporated by reference wherein in its entirety.

What is claimed is:

1. A silicon substrate processing method comprising:
providing a silicon substrate with a sacrificial layer formed in a form of an island on a front surface thereof, the front surface being a surface on a side where a flow path of an ejection port for ejecting liquid is to be formed, the sacrificial layer having a higher etching rate than the silicon substrate;
forming a mask layer on a back surface of the silicon substrate, the back surface being a surface opposite from the front surface, the mask layer being a layer that does not include an opening at a portion of the back surface opposite from the sacrificial layer;
forming a non-penetrating hole from an opening on the back surface of the silicon substrate; and
forming a beam on the back surface side by performing anisotropic etching on the silicon substrate in which the non-penetrating hole is formed.

2. The silicon substrate processing method according to claim 1, wherein the silicon substrate is a substrate of monocrystalline silicon with the back surface having a crystal axis on a (100) plane.

3. The silicon substrate processing method according to claim 1, wherein the sacrificial layer defines an opening width of a supply port for the liquid on the front surface side.

4. The silicon substrate processing method according to claim 1, wherein the forming of the beam includes forming a supply port for the liquid.

5. The silicon substrate processing method according to claim 1, wherein the non-penetrating hole is formed by laser processing, dry etching, or machining.

6. The silicon substrate processing method according to claim 1, wherein the non-penetrating hole is formed to a depth of not smaller than 15 µm and not larger than 75 µm from the front surface.

7. The silicon substrate processing method according to claim 1, wherein a pitch of the non-penetrating hole is not smaller than 25 µm and not larger than 500 µm.

8. The silicon substrate processing method according to claim 1, wherein a size of the island of the sacrificial layer is not smaller than 120 µm and not larger than 1100 µm.

9. The silicon substrate processing method according to claim 1, wherein the mask layer is formed to satisfy $$L-(T1/\tan 54.7°)\times 2 \geq X1 \geq L-(T2/\tan 54.7°)\times 2$$

where X1 is a dimension of a portion of the mask layer that does not include the opening at the portion of the back surface opposite from the sacrificial layer, L is a size of the island of the sacrificial layer, and a depth of the non-penetrating hole from the surface that is to communicate with the flow path of the ejection port for the liquid is not smaller than T1 and not larger than T2.

10. The silicon substrate processing method according to claim 1, wherein a length of a mask portion of the mask layer not including the opening at the portion of the back surface opposite from the sacrificial layer is not smaller than 98 µm and not larger than 993 µm.

11. The silicon substrate processing method according to claim 1, wherein
the forming of the beam is performed by anisotropic etching using an alkaline solution, and
an etching rate of the sacrificial layer with the alkaline solution is higher than an etching rate of the silicon substrate with the alkaline solution.

12. The silicon substrate processing method according to claim 1, wherein a portion of the provided silicon substrate including the island-form sacrificial layer is covered by an etching stop layer.

13. The silicon substrate processing method according to claim 12, wherein the etching stop layer is formed at a same process as forming of an ejection energy generating element on the silicon substrate, the ejection energy generating element being an element that ejects the liquid.

14. A liquid ejection head manufacturing method comprising:
- forming a sacrificial layer, an etching stop layer, and an ejection energy generating element on a first surface of a silicon substrate, the sacrificial layer being formed in a form of an island and having a higher etching rate than the silicon substrate, the etching stop layer covering a portion of the first surface including the island-form sacrificial layer, the ejection energy generating element being an element that ejects liquid;
- forming a flow path forming member that forms a flow path for the liquid, further on the first surface of the silicon substrate;
- forming a mask layer on a second surface of the silicon substrate, the second surface being a surface opposite from the first surface, the mask layer being a layer that does not include an opening at a portion of the second surface opposite from the sacrificial layer;
- forming a non-penetrating hole from an opening on the second surface of the silicon substrate; and
- forming a beam on the second surface side by performing anisotropic etching.

* * * * *